US 6,556,456 B1

(12) United States Patent  (10) Patent No.: US 6,556,456 B1
Takehara                    (45) Date of Patent:    Apr. 29, 2003

(54) DEVICE FOR SHIELDING ELECTRONIC CIRCUIT FOR AIRCRAFT (75) Inventor: Takao Takehara, Ota-ku (JP)

(73) Assignee: Minebea Co., Ltd., Nagano (JP)

( * ) Notice: Subject to any disclaimer, the term of this patent is extended or adjusted under 35 U.S.C. 154(b) by 0 days.

(21) Appl. No.: 09/419,975

(22) Filed: Oct. 18, 1999

(30) Foreign Application Priority Data

Feb. 16, 1999 (JP) ............................................. 11-037372

(51) Int. Cl.$^7$ .................................................. H05K 9/00
(52) U.S. Cl. ........................ 361/818; 361/679; 361/704; 361/752; 361/719; 361/800; 361/816; 174/35 R; 257/659
(58) Field of Search ................................ 361/688, 704, 361/707, 714, 717–719, 816, 818; 174/16.3, 35 R, 356 C; 165/80.2, 80.3

(56) References Cited

U.S. PATENT DOCUMENTS

| 4,218,578 A | * | 8/1980 | Olschewski et al. ...... 174/35 R |
| 4,754,101 A | * | 6/1988 | Stickney et al. .......... 174/35 R |
| 4,894,749 A |   | 1/1990 | Elko et al. |
| 5,095,177 A | * | 3/1992 | Johnson .................... 174/35 R |
| 5,278,351 A | * | 1/1994 | Herrick ....................... 361/818 |
| 5,353,201 A | * | 10/1994 | Maeda ........................ 361/816 |
| 5,354,951 A | * | 10/1994 | Lange, Sr. et al. .......... 361/818 |
| 5,386,346 A | * | 1/1995 | Gleadall ..................... 361/799 |
| 5,414,597 A | * | 5/1995 | Lindland et al. ............ 361/816 |
| 5,416,668 A | * | 5/1995 | Benzoni ..................... 361/816 |
| 5,561,265 A | * | 10/1996 | Livshits et al. ......... 174/35 GC |
| 5,844,784 A | * | 12/1998 | Moran et al. ............... 361/818 |
| 5,847,938 A | * | 12/1998 | Gammon ................... 361/816 |
| 5,880,930 A | * | 3/1999 | Wheaton .................... 361/690 |
| 5,883,791 A | * | 3/1999 | Deguchi ..................... 361/818 |
| 6,028,775 A | * | 2/2000 | Batten, Jr. et al. ......... 361/816 |

FOREIGN PATENT DOCUMENTS

| JP | 63070493 | 3/1988 |
| JP | 63313899 | 12/1988 |
| JP | 06052767 | 2/1994 |
| JP | 08107286 | 4/1996 |
| JP | 09046078 | 2/1997 |

OTHER PUBLICATIONS

Patent Abstract of Japan, vol. 013, No. 160 (E–744), Apr. 18, 1989.
Patent Abstract of Japan, vol. 018, No. 275, (E–1553), May 25, 1994.
Patent Abstract of Japan, vol. 1996, No. 08, Aug. 30, 1996.
Patent Abstract of Japan, vol. 1997, No. 06, Jun. 30, 1997.

* cited by examiner

Primary Examiner—Leo P. Picard
Assistant Examiner—Boris L. Chervinsky
(74) Attorney, Agent, or Firm—Oliff & Berridge, PLC (57) ABSTRACT Of the electronic components used for a video monitor installed in an aircraft, components 14 radiating electromagnetic waves are covered with a case formed by combining first and second metal plates 16,17, and part of the case is connected to a frame ground. By connecting the case to the frame ground, the radiation of electromagnetic waves is suppressed.

4 Claims, 10 Drawing Sheets

DEVICE FOR SHIELDING ELECTRONIC CIRCUIT FOR AIRCRAFT

BACKGROUND OF THE INVENTION

1. Field of the Invention

The present invention relates to a device for shielding an electronic circuit for aircraft, which is applied to a video monitor installed in aircraft.

2. Description of the Related Art

Of various types of aircraft, there are passenger planes installing video monitors (hereinafter referred to as "monitor") for explaining safety equipment and showing programs such as movies to passengers. While projectors or CRTs (cathode ray tubes) have been mostly used as the conventional monitors, liquid-crystal panels with improved sharpness are gaining popularity in recent years. When a liquid-crystal panel is used as the monitor, the screen is necessary to be made smaller than that of the conventional projector or the like, which needs also its electronic circuit for showing images to be made compact.

The electronic circuit of the electrical equipment includes components that radiate electromagnetic waves. Since the radiation of electromagnetic waves may, in some cases, give damage to the manipulating equipment of the aircraft, the components must be shielded so that the electromagnetic waves should not leak outside. By the way, when the electronic circuits are made compact as described above, it is difficult to shield the components, and hence the whole electronic circuits are to be shielded.

Figure 11:
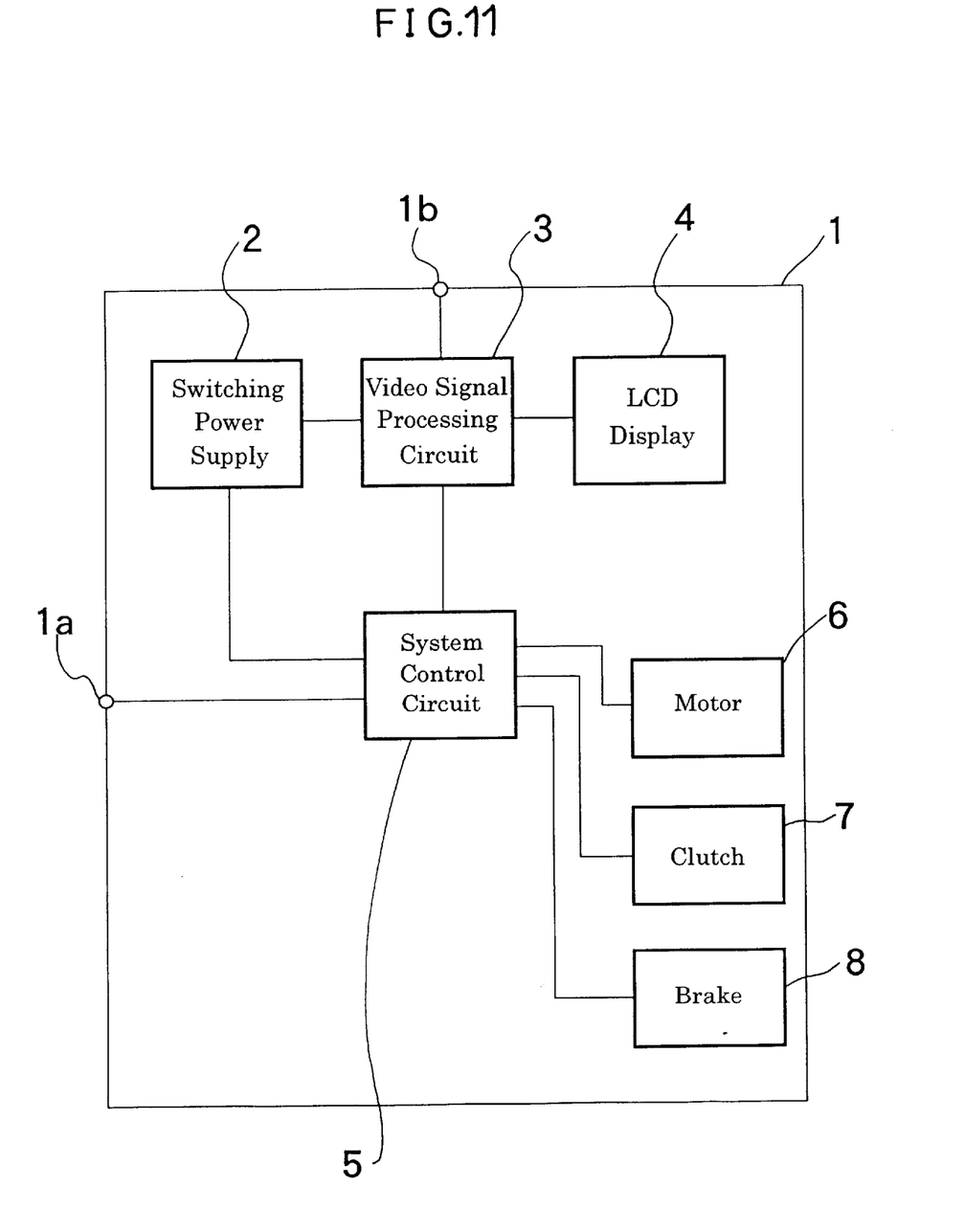
FIG. 11 is a block diagram showing an electronic circuit to which the present invention is applied.

How this is implemented will be described. FIG. 11 is a block diagram showing a video display unit, which comprises a chassis plate 1, a switching power supply 2, a video signal processing circuit 3, an LCD display 4, a system control circuit 5, a motor 6, a clutch 7 and a brake 8 or the like. These components are connected as shown in FIG. 11. The chassis plate 1 has an ON/OFF signal input terminal 1a and a video signal input terminal 1b. The ON/OFF signal input terminal 1a is connected to the system control circuit 5, and the video signal input terminal 1b to the video signal processing circuit 3.

In this video display unit, when an ON signal is inputted to the ON/OFF signal input terminal 1a, the system control circuit 5 operates the switching power supply 2, so that predetermined power supply voltage is supplied to predetermined components. Then, when a video signal is inputted to the video signal input terminal 1b, the video signal processing circuit 3 is operated, so that an image is displayed on the LCD display 4. The motor 6 drives the LCD display 4 between the storage position and the display position. The clutch 7 and the brake 8 serve as auxiliary mechanisms for moving the display 4.

A CPU incorporated in the system control circuit 5 performs video display control as well as the whole control over the driving of the LCD display 4. The power supply voltages include a logic voltage supplied from the switching power supply 2, 5 V for operating the video signal, 24 V for supplying power to the clutch and the brake, and ON/OFF signals (28 V) from the aircraft body.

Figure 12:
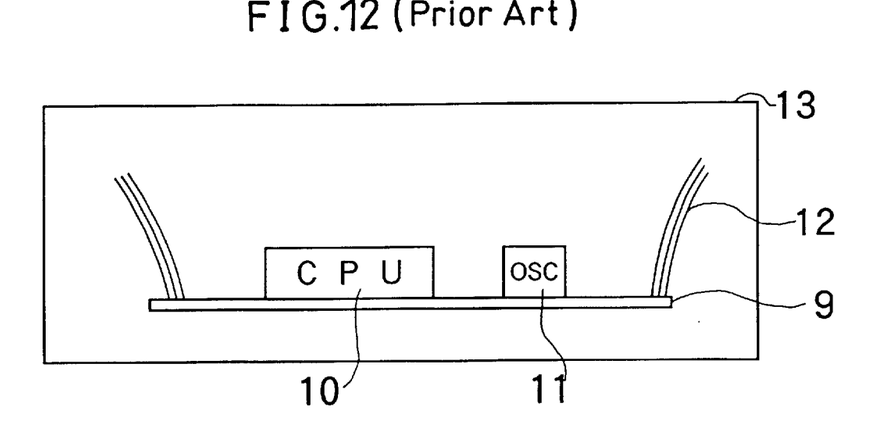
FIG. 12 is a diagram schematically illustrating an exemplary conventional structure.
Figure 13:
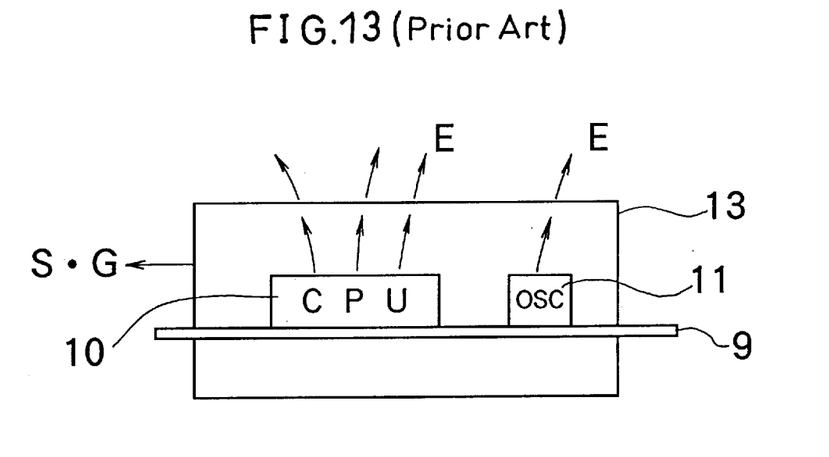
FIG. 13 is a diagram schematically illustrating another exemplary conventional structure.

The CPU and a clock oscillation circuit could be the source of noise (electromagnetic waves) in the system control circuit 5. In the arrangement shown in FIG. 11, the electromagnetic waves generated from the CPU and the clock oscillation circuit are radiated to the pattern and the wiring of the printed board of the system control circuit 5 and emitted as electromagnetic waves. In order to suppress such emission of electromagnetic waves, a metal plate 13 may be used to cover a printed board 9, and a CPU 10, a clock oscillation circuit 11, wiring cables 12 and the like that are attached to the board 9 as shown in FIG. 12. However, if the covering metal plate 13 is connected to a circuit ground (ground circuit on the board) S G as shown in FIG. 13, these components covered by the metal plate 13 are not completely shielded, thereby leaking electromagnetic waves E. To overcome this inconvenience, the metal plate 13 is connected to a frame ground (ground circuit for the whole circuit) F.G, so that satisfactory shielding effects are obtained.

The connection of the metal plate 13 to the frame ground F.G will be described. The ground (circuit ground) for the output voltage (5 V and 24 V) of the switching power supply is connected through a capacitor (1000 pF), without being directly connected to the frame ground F.G. The reason is that the switching noise current flowing into the chassis (frame ground) is increased to thereby increase electromagnetic radiation and noise terminal voltage. Therefore, the circuit ground is not actually grounded for the circuit, and hence, when the metal plate is connected to the circuit ground under this condition, the potential of the metal plate is not grounded, either. That is, as shown in FIG. 13, the electromagnetic waves E are emitted from the metal plate 13. Noise does not propagate if the electromagnetic waves E are contained within the circuit so as not to be emitted outside as much as possible. Consequently, this technique is not appropriate.

Figure 14:
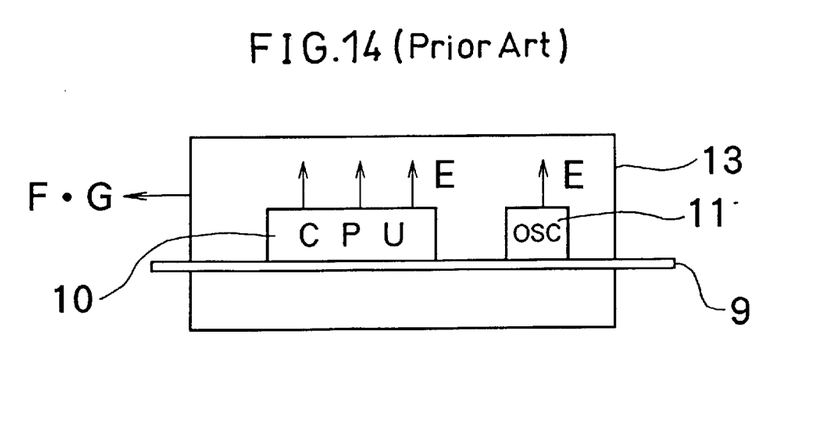
FIG. 14 is a diagram schematically illustrating still another exemplary conventional structure.

As another technique for suppressing the emission of electromagnetic waves, the metal plate 13 may be connected to the frame ground F.G that is the stablest potential in the system as shown in FIG. 14. However, when many wirings are connected to the unit, it is not possible to cover the whole unit with the metal plate 13 structurally. Further, even when the unit is completely sealed, heat radiation effects are deteriorated, and hence this technique is not satisfactory, either.

SUMMARY OF THE INVENTION

The present invention has been made in view of these circumstances, and an object of the present invention is therefore to provide a structure in which metal plates are used to cover only components to be shielded, i.e., a CPU and a clock circuit that radiate electromagnetic waves generated in an electronic circuit and in which the metal plates are connected to the chassis (frame ground).

According to a first aspect of the present invention, there is provided a device for shielding an electronic circuit for aircraft, wherein a case formed of metal plates covers the outer circumference of a component to be shielded which radiates electromagnetic waves in an electronic circuit of electrical equipment to be installed in an aircraft, and part of the case is connected to a frame ground.

According to a second aspect of the present invention, in a device for shielding an electronic circuit for aircraft according to the first aspect of the invention, the case is a box-like member formed by combining a first metal plate that is U-shaped by bending both end portions thereof upward to form erect portions and a second metal plate that is U-shaped by bending side portions thereof downward to form erect portions, in such a manner that a middle portion of the first metal plate is placed below the component to be shielded and the erect portions on both end portions of the first metal plate are projected outside both end portions of the component to be shielded and a middle portion of the second metal plate is placed above the component to be shielded and openings at both side portions of the first metal plate are covered with the erect portions on both side portions of the second metal plate.

According to a third aspect of the present invention, in a device for shielding an electronic circuit for aircraft according to the first aspect of the invention, the case is formed by combining a first metal plate that is a flat plate having projections on both end portions thereof and a second metal plate that is a box-like member having four sides of a flat portion thereof bent downward so as to have only one opening on the bottom thereof, in such a manner that the first metal plate is placed below the component to be shielded and the second metal plate covers the component to be shielded from above.

According to a fourth aspect of the present invention, in a device for shielding an electronic circuit for aircraft according to the second or third aspect of the invention, the middle portion of the first metal plate has a width substantially equal to or smaller than a width of the component to be shielded.

According to a fifth aspect of the present invention, in a device for shielding an electronic circuit for aircraft according to the second or third aspect of the invention, the first metal plate and the second metal plate are combined by clamping part of one of the metal plates with an elastic force of the other metal plate.

According to a sixth aspect of the present invention, in a device for shielding an electronic circuit for aircraft according to the second or third aspect of the invention, the first metal plate and the second metal plate are combined by engaging recess portions or holes formed in part of one of the metal plates with projections formed on the other metal plate.

According to a seventh aspect of the present invention, there is provided a device for shielding an electronic circuit for aircraft, wherein an electronic circuit of electrical equipment to be installed in an aircraft is formed of a plurality of laminated printed boards, and components to be shielded that radiate electromagnetic waves in the electronic circuit are arranged on intermediate ones of the plurality of printed boards so that uppermost and lowermost ones of the plurality of printed boards cover the components to be shielded, and at least part of one of the uppermost and lowermost printed boards is connected to a frame ground.

According to an eighth aspect of the present invention, there is provided a device for shielding an electronic circuit for aircraft, an electronic circuit of electrical equipment to be installed in an aircraft is formed on the outermost ones of a plurality of laminated printed boards, and components to be shielded that radiate electromagnetic waves in the electronic circuit are arranged on the outermost printed boards, and ones of the plurality of printed boards interposed between the outermost printed boards incorporating the electronic circuit therein are connected to a frame ground.

According to a ninth aspect of the present invention, there is provided a device for shielding an electronic circuit for aircraft, an electronic circuit of electrical equipment to be installed in an aircraft is formed of a printed board, and a component to be shielded that radiates electromagnetic waves in the electronic circuit is covered with the metal plates attached to both surfaces of the printed board.

According to a tenth aspect of the present invention, there is provided a device for shielding an electronic circuit for aircraft, an electronic circuit of electrical equipment to be installed in an aircraft is formed of a printed board, and metal plates serving also as a heat sink are arranged on one surface of a component to be shielded that radiates electromagnetic waves in the electronic circuit so as to come in contact with the surface of the component.

As the structures provided by the first to sixth aspects of the present invention, when the outer circumferences of components to be shielded, such as a CPU and a clock circuit that radiate electromagnetic waves, are covered with a case made of metal plates and part of the case is connected to the frame ground, the radiation of electromagnetic waves outside can be suppressed reliably. Further, as the structures provided by the seventh and eighth aspects of the present invention, when a plurality of printed boards are used and part of such printed boards is connected to the frame ground, the leakage of electromagnetic waves outside can be likewise prevented. Still further, according to the ninth aspect of the present invention, the metal plates attached to both surfaces of the printed board shield the component to be shielded completely, and according to the tenth aspect of the present invention, the shielding and heat radiation for the heat radiating component to be shielded can be implemented at the same time.

DETAILED DESCRIPTION OF THE PREFERRED EMBODIMENTS

Hereinafter, an embodiment of the present invention will now be described with reference to FIG. 1 that is an exploded view. The member denoted by reference numeral 14 is a component to be shielded (hereinafter referred to as "component") that is constructed of an integrated circuit, and radiates electromagnetic waves when operating. Many connection terminals 14a project downward from the side portions thereof, and are connected to holes 15a formed in a printed board 15 while inserted into the holes 15a. For the connection, a small clearance is provided between the lower surface 14b of the component 14 and the upper surface of the printed board 15.

Figure 1:
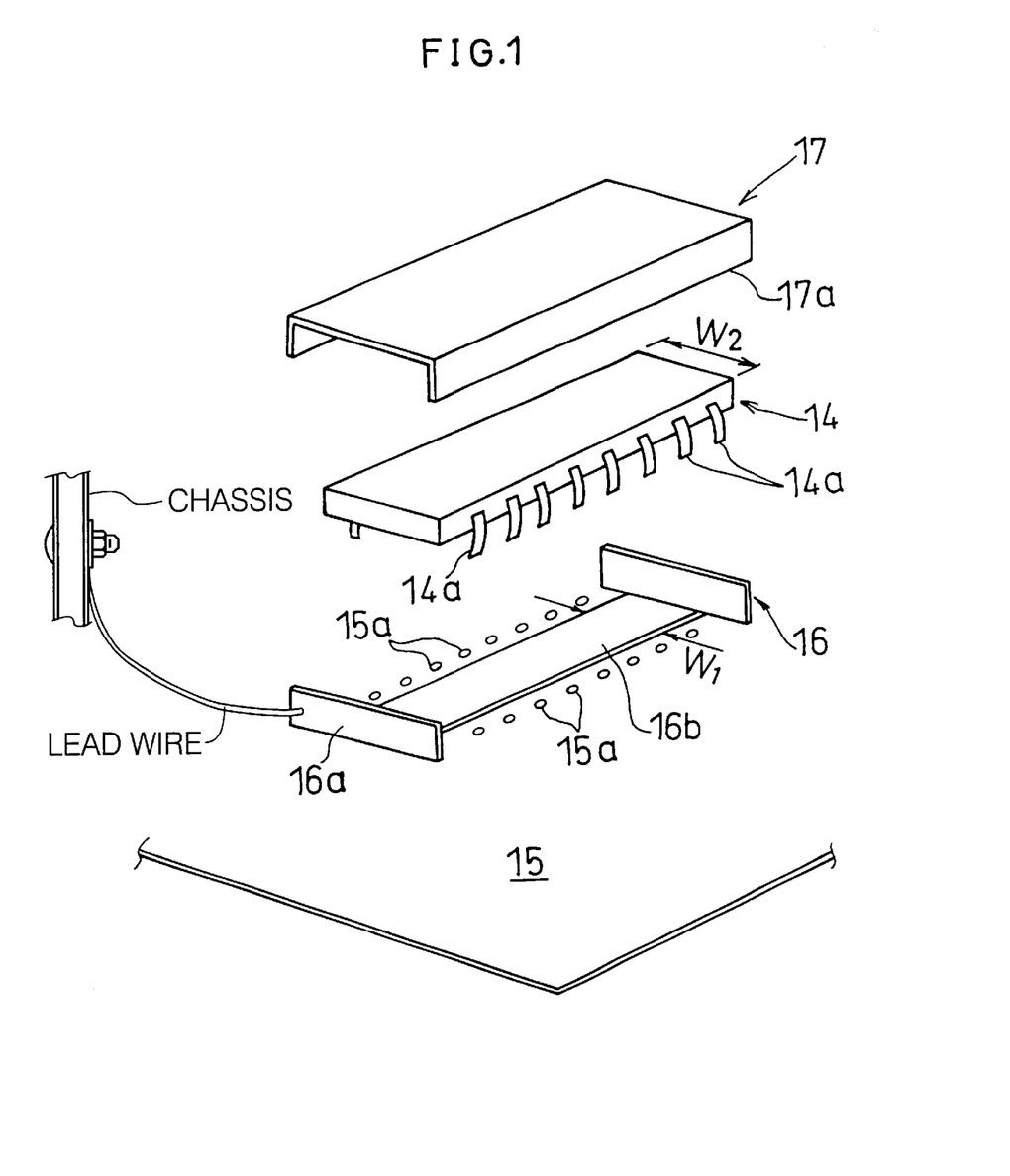
FIG. 1 is a perspective view showing a case, which is an embodiment of the present invention, in an exploded form.

In FIG. 1, the members denoted by reference numerals 16 and 17 are a first metal plate and a second metal plate, respectively. When these plates 16 and 17 are combined, a case is formed. The first metal plate 16 is U-shaped by bending both end portions thereof upward to form erect portions 16a. The width W1 of its middle portion 16b is set to be substantially equal to or smaller than the width W2 of the component 14. That is, the first metal plate 16 is interposed between the connection terminals 14a and 14a projecting downward from both sides of the component 14 so as not to be in contact with these terminals 14a and 14a.

On the other hand, the second metal plate 17 is U-shaped by bending the side portions thereof downward to form erect portions 17a. When the first and second metal plates 16 and 17 are combined together, a case, which is box-like on the whole, is formed. That is, the plate 17 is lowered from above the plate 16 so as to cover the openings at the sides of the plate 16 with the erect portions 17a and, under this condition, the erect portions 17a are combined with the erect portions 16a of the plate 16.

Before combining these metal plates 16 and 17, the connection terminals 14a are connected to the circuit by placing the first metal plate 16 on the printed board 15, arranging the component 14 above the plate 16, and inserting the terminals 14a into the holes. While the first metal plate 16 may be clamped between the printed board 15 and the component 14, the plate 16 may also be fixed to the printed board 15 by other appropriate means. Then, part of the first metal plate 16 is connected to a chassis (frame ground) by a lead (not shown) or the like.

The first metal plate 16 and the second metal plate 17 can be combined by clamping part of one of the plates with the elastic force of the other plate, or, in a manner similar to an embodiment to be described later, by engaging recess portions or holes formed in part of one of the plates with projections formed on the other plate. It goes without saying that the plates 16 and 17 can be combined by welding or the like.

Figure 2:
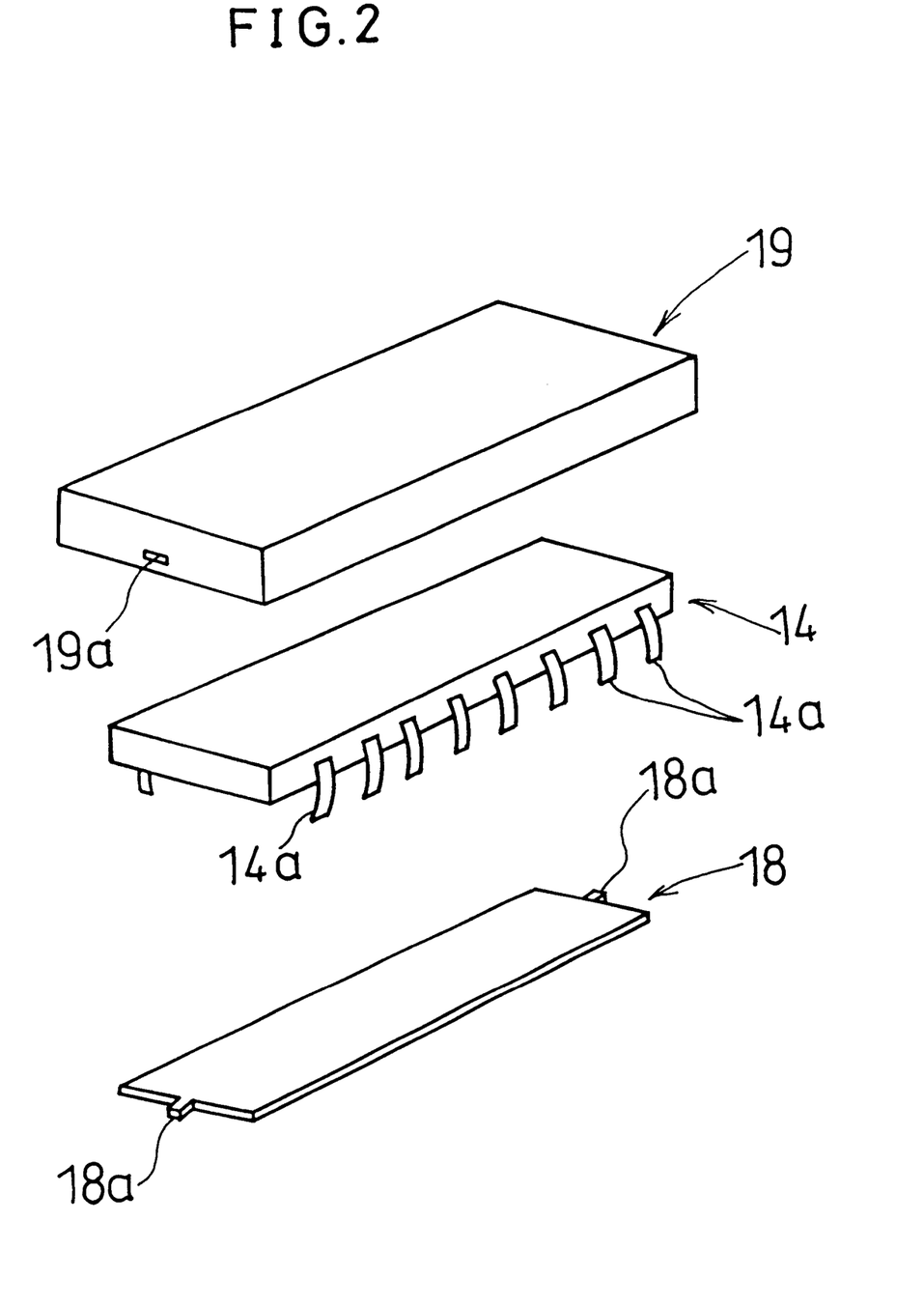
FIG. 2 is a perspective view showing a case, which is another embodiment of the present invention, in an exploded form.

FIG. 2 is a diagram showing another example of an embodiment of the present invention. In this case, a first metal plate 18 is formed of a flat plate that has no erect portions but has projections 18a formed on both end portions thereof. On the other hand, a second metal plate 19 is shaped like a box with the bottom thereof opened. The second metal plate 19 has holes (or recess portions) 19a, so that the holes 19a engage with the projections 18a of the first metal plate 18. In this embodiment, a case is formed by placing the first metal plate 18 on the printed board 15, arranging the component 14 above the plate 18, and thereafter by lowering the second metal plate 19 from above to engage the holes (or the recess portions) 19a with the projections 18a. Also, in this embodiment, part of the first metal plate 18 is connected to the chassis (frame ground).

Figure 3:
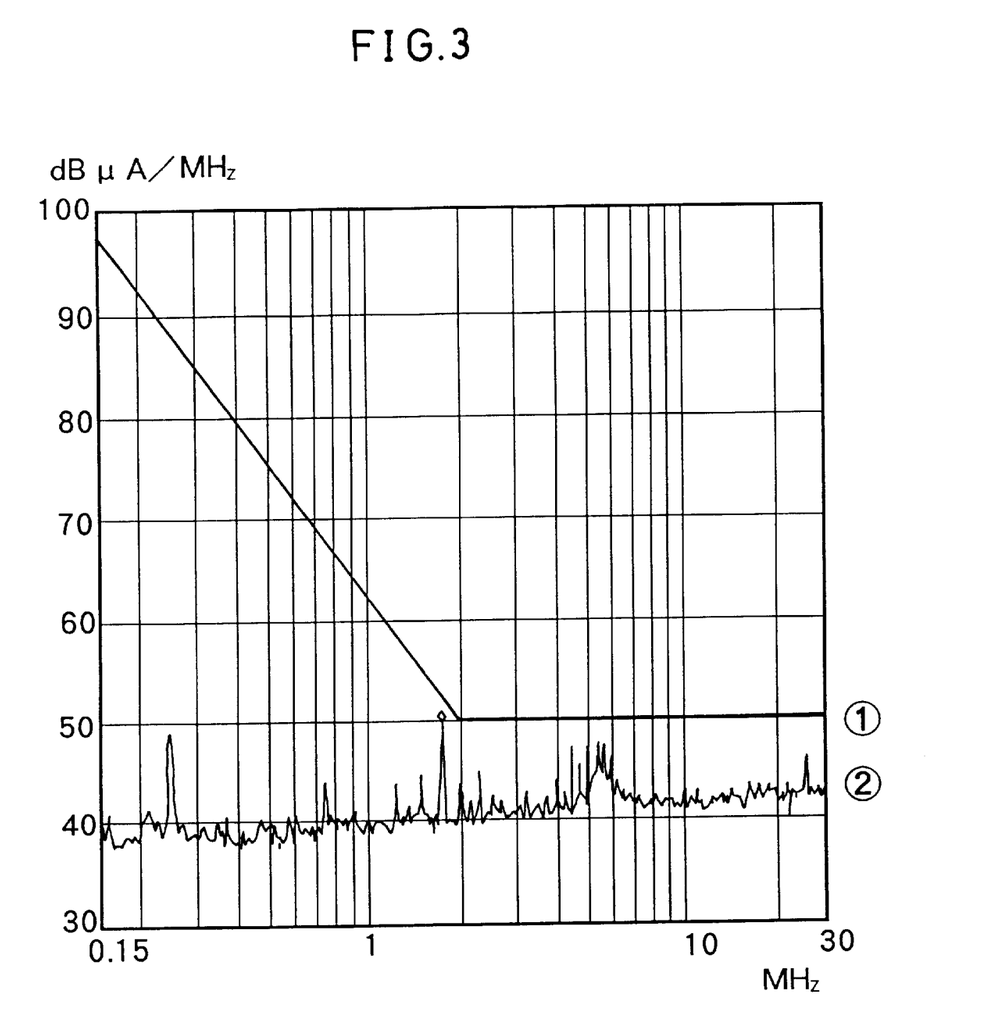
FIG. 3 is a graph showing a measurement data of noise terminal voltage in the embodiments of the present invention.
Figure 4:
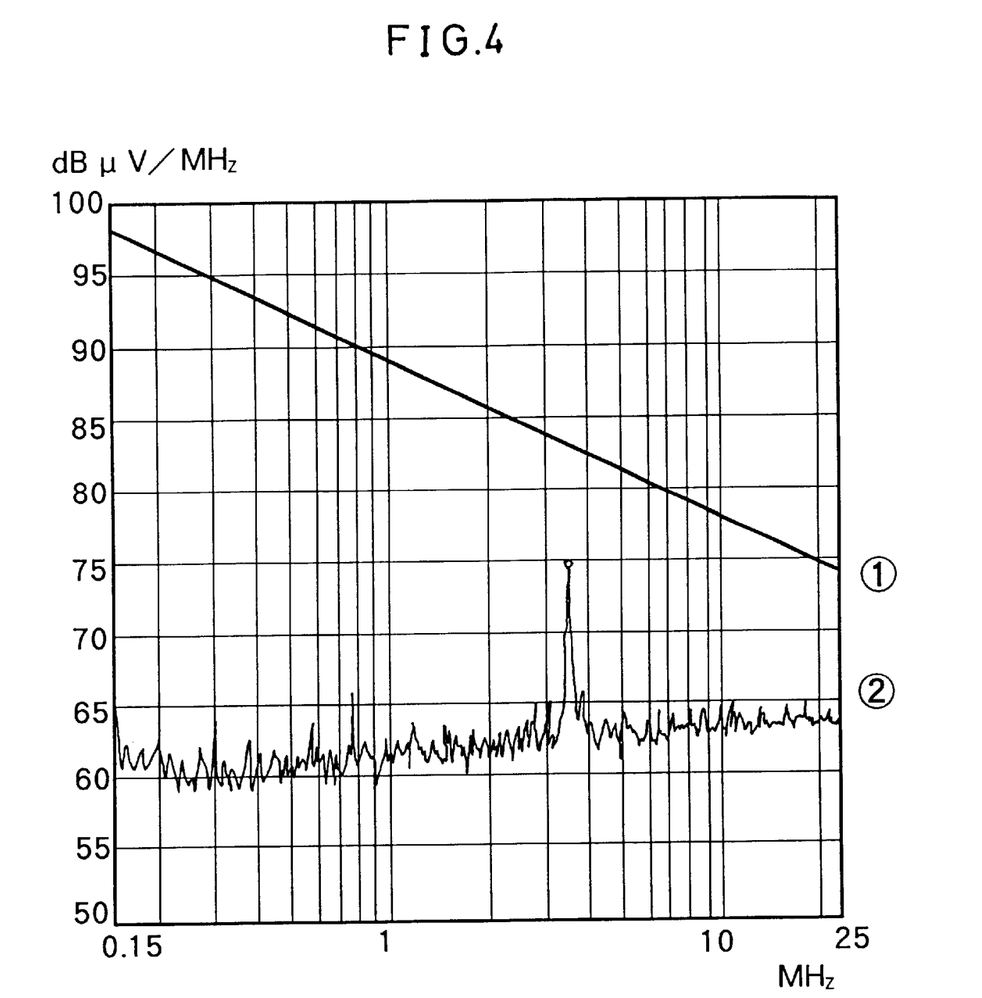
FIG. 4 is a graph showing a measurement data of radiation electric field strength in the embodiments of the present invention.
Figure 5:
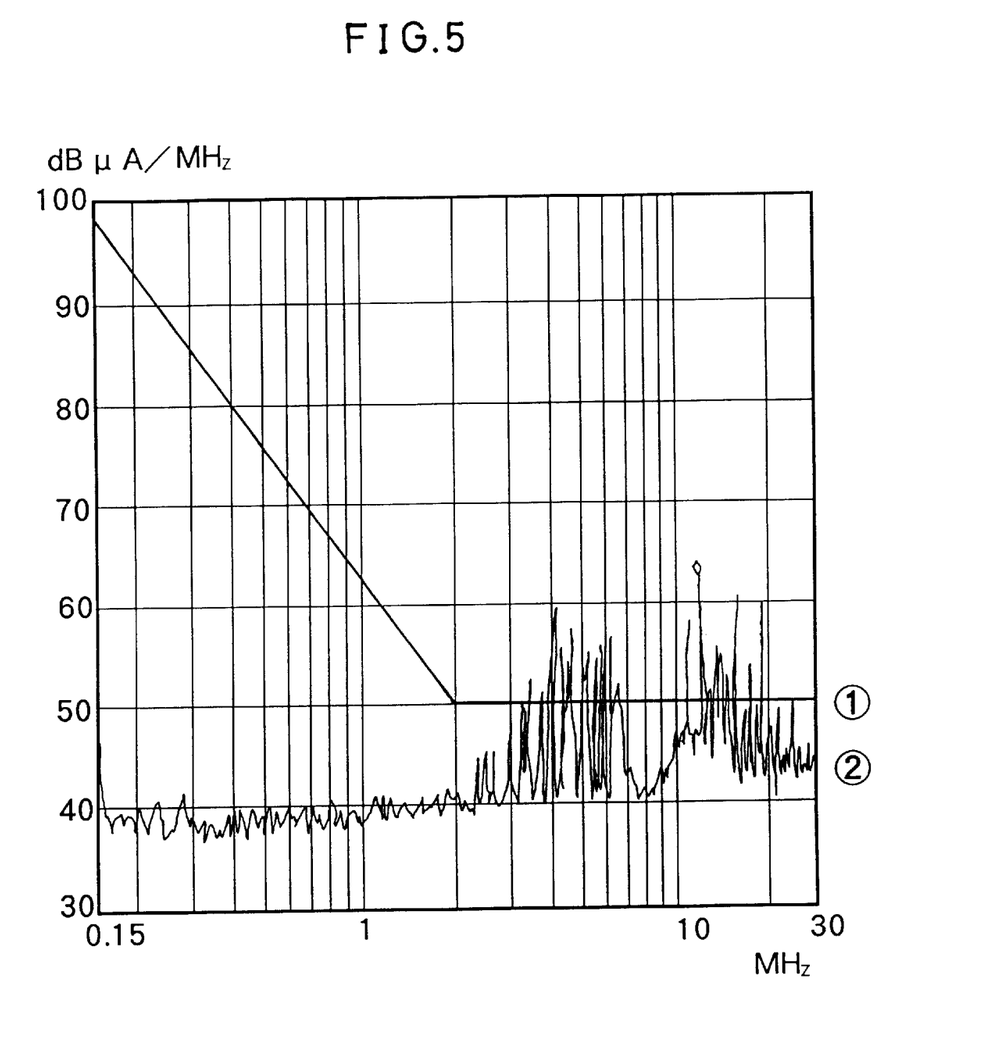
FIG. 5 is a graph showing a measurement data of noise terminal voltage in a conventional example with no shield.
Figure 6:
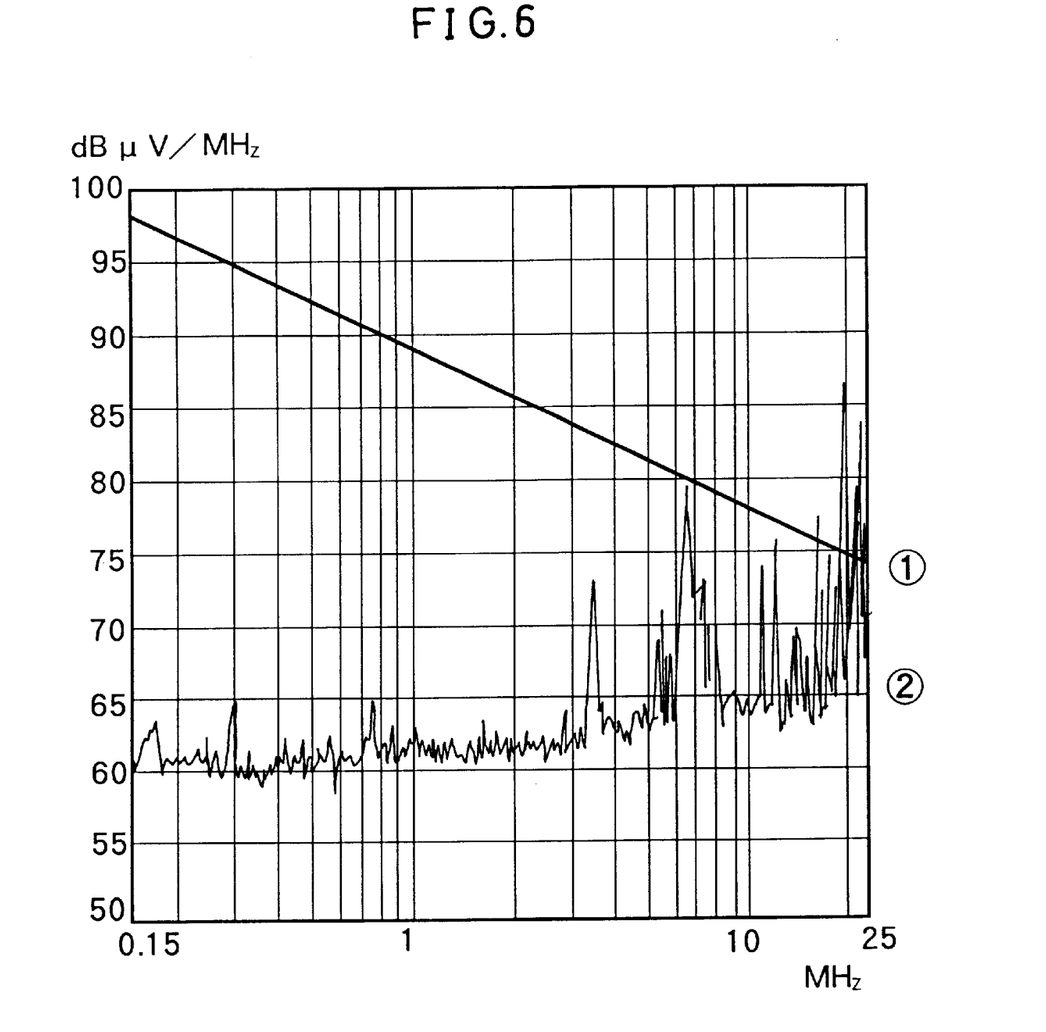
FIG. 6 is a graph showing a measurement data of radiation electric field strength in the conventional example with no shield.

FIGS. 3 and 4 show noise terminal voltage and radiation electric field strength in the embodiments of the present invention in each of which the component is shielded with the case. Further, FIGS. 5 and 6 show the corresponding measurement data in a conventional example in which the component is not shielded. The line $\hat{1}$ indicates the critical value specified by the EMI Standards for aircraft (i.e., devices used for aircraft must have their measurement data lower than this line). The data $\hat{2}$ indicates the measurement data. The abscissa in FIGS. 3 and 5 showing the noise terminal voltage is expressed in megahertz, and the ordinate in decibel microampere/megahertz. The abscissa in FIGS. 4 and 6 showing the radiation electric field strength is expressed in megahertz, and the ordinate in decibel microvolt/megahertz.

As apparent from these drawings, the noise terminal voltage and the radiation electric field strength of the conventional example exceed their critical values specified by the EMI Standards in part of the measured range, whereas those of the embodiments of the present invention are reduced to lower levels, and hence never exceed their critical values.

While the examples in which the component 14 is covered with the case that is formed by combining the first and second metal plates as means for preventing the leakage of electromagnetic waves from the component 14 has been described in the aforementioned two embodiments, the present invention is not limited to these embodiments.

Figure 7:
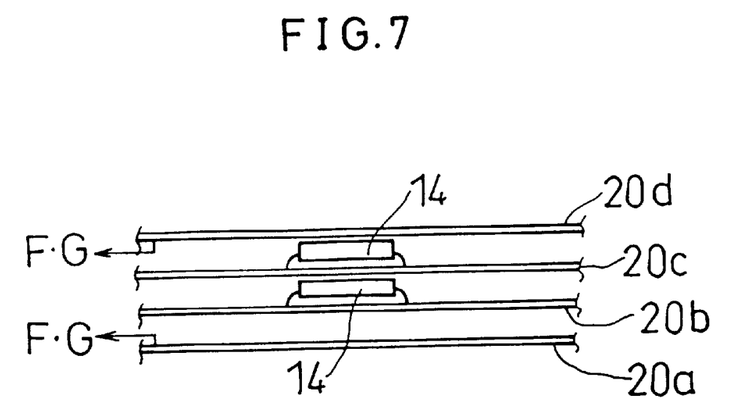
FIG. 7 is a side view schematically showing a multi-layered substrate that is an embodiment of the present invention.

FIG. 7 shows an embodiment in which no case is used. In this embodiment, the electronic circuit of electrical equipment to be installed in an aircraft is formed of a plurality of laminated printed boards 20a to 20d. The components 14 that radiate electromagnetic waves in the electronic circuit are arranged on the intermediate ones 20b and 20c of the plurality of printed boards 20a to 20d with the uppermost and lowermost printed boards 20a and 20d covering the intermediate printed boards 20b and 20c, and parts of the uppermost and lowermost printed boards 20a and 20d are connected to the frame ground, respectively. In this embodiment, parts of both the uppermost and lowermost printed boards 20a and 20d are connected to the frame ground, respectively. However, substantially the same advantage can be obtained also by connecting, not both, but only one of these printed boards, to the frame ground.

Figure 8:
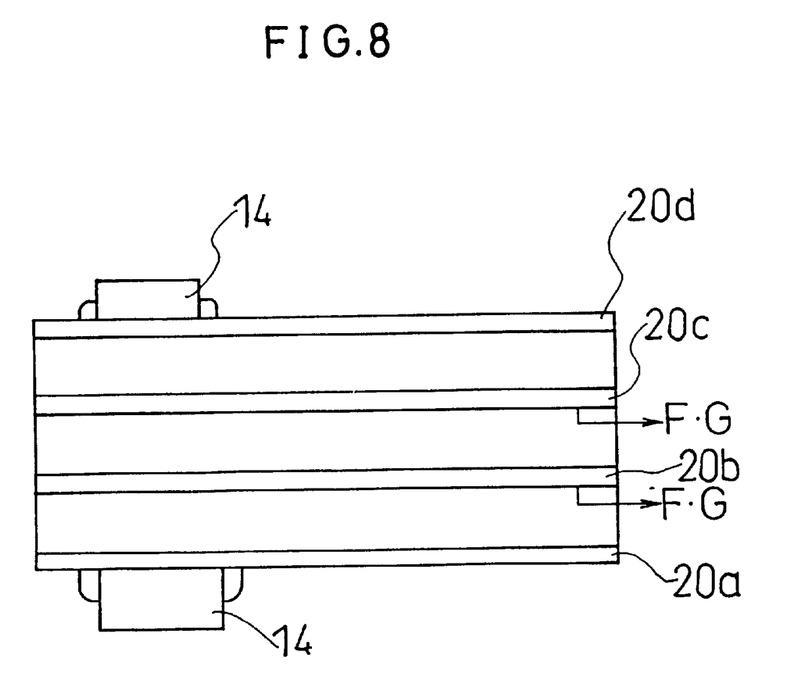
FIG. 8 is a side view schematically showing a multi-layered substrate that is another embodiment of the present invention.

FIG. 8 shows another embodiment in which no case is used. In this case, the electronic circuit of electrical equipment to be installed in an aircraft is formed on the outermost ones 20a and 20d of four laminated printed boards 20a to 20d. The components 14 that radiate electromagnetic waves in the electronic circuits are mounted on the outermost printed boards 20a and 20d, and the conductors (the lower surfaces in FIG. 8) of the printed boards 20b and 20c interposed between the printed boards 20a and 20d incorporating the electronic circuit are connected to the frame ground, respectively. In this structure, the number of printed boards may be more than four.

Even with these two embodiments in which no case is used, substantially the same advantage as that of the previously described embodiments can be obtained, as long as the frame ground is provided reliably. In these two embodiments, electromagnetic waves generated from the pattern and components other than the CPU and the oscillation circuit concentrate on the ground plane. As a result, these embodiments have a higher capacity for suppressing electromagnetic waves.

Figure 9:
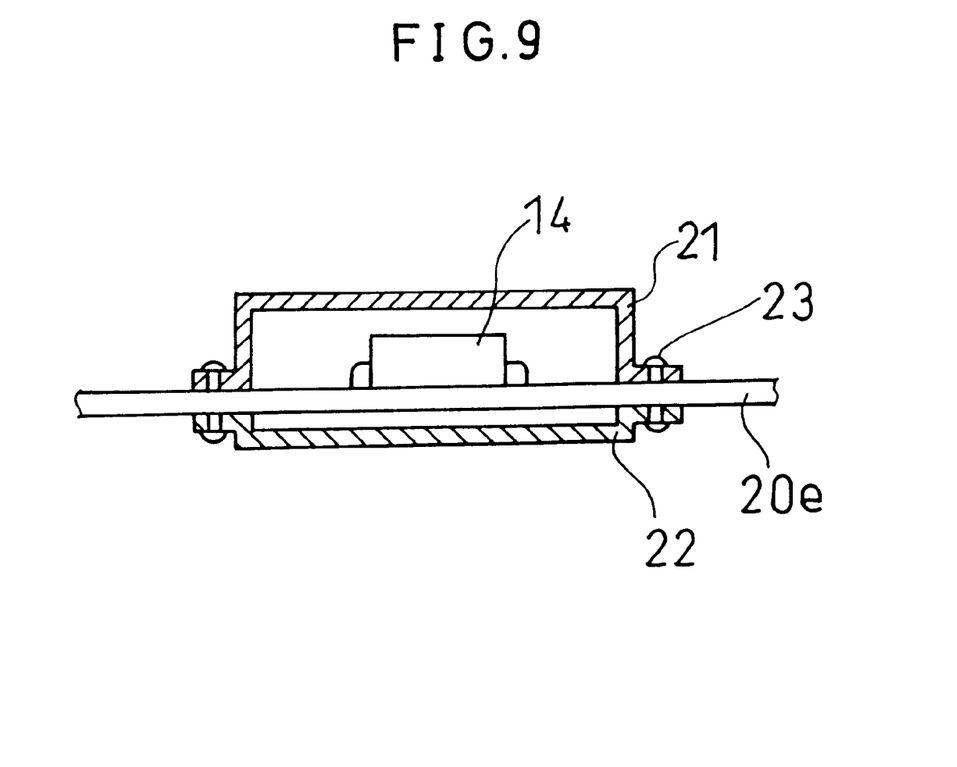
FIG. 9 is a partially sectional view showing an embodiment of the present invention in which metal plates are provided on both sides of a printed board.

FIG. 9 shows an embodiment in which metal plates are attached to both surfaces of a printed board. That is, the component (IC) 14 that radiates electromagnetic waves in an electronic circuit is attached to a printed board 20e. Metal plates 21 and 22, each having a U-shaped cross section, are arranged on both the component 14 and the reverse side of the printed board 20e, respectively, and fixed with fasteners 23. These metal plates 21 and 22 are connected to the frame ground through the circuit on the printed board 20e. In this structure, even if the electromagnetic waves generated by the component (IC) 14 pass through the printed board 20e, these electromagnetic waves are shielded by the lower metal plate 22 mounted on the lower side of the printed board 20e. Thus, this structure is suitable when components that generate a large amount of electromagnetic waves are used.

Figure 10:
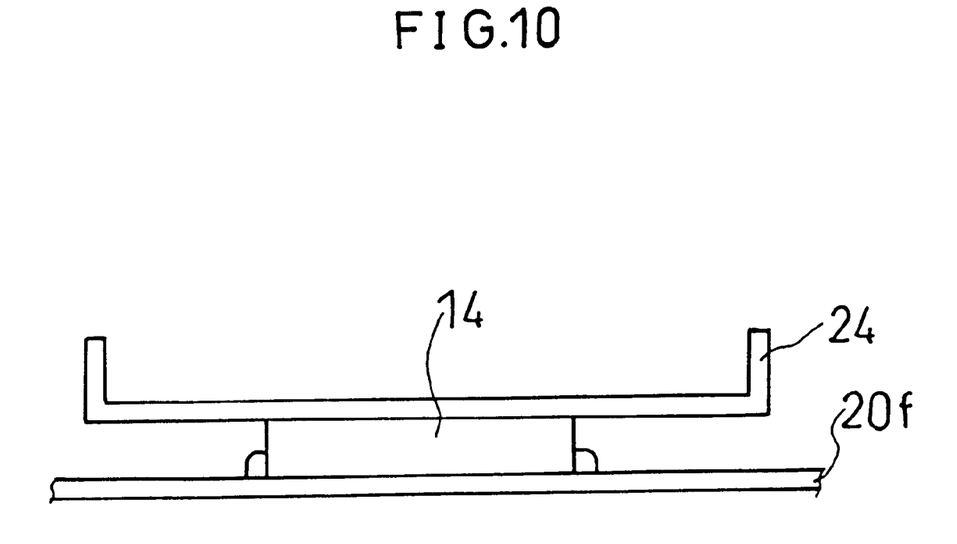
FIG. 10 is a side view showing an embodiment of the present invention in which metal plates serving also as a heat sink are provided.

FIG. 10 shows an embodiment that is suitable when a component 14 that generates a small amount of electromagnetic waves but produces a large calorific value is used. In this case, a metal plate 24 serving also as a heat sink is brought into contact with the upper surface of the component 14 that is attached to a printed board 20f. This construction allows the component 14 to be shielded against electromagnetic waves and to radiate its heat at the same time. Note that the metal plate 24 is connected to the frame ground in this case.

The present invention provides the thus constructed devices for shielding an electronic circuit for aircraft. Therefore, according to the first aspect of the present invention, only a component, which is a source of noise, is covered with a case made of metal plates instead of shielding the whole system, and part of the case is connected to the frame ground. As a result of this structure, electromagnetic radiation can be greatly reduced. If the aforementioned measure is not taken, magnetic materials such as ferrite beads are needed in order to absorb electromagnetic energy radiated onto wiring cables and the like. However, according to the invention, such magnetic materials are no longer needed, and hence the production cost can be reduced. In addition, the case made of the metal plates covers only the noise source, and hence the production cost can be reduced.

Further, according to the second and third aspects of the present invention, the case for covering the component can be constructed with a simple structure, and in addition, so as to cover the outer circumference of the component satisfactorily by using the first and second metal plates. In this case, according to the fourth aspect of the invention, the metal plates never affect the connection terminals of the component. Still further, according to the fifth and sixth aspects of the present invention, the first and second metal plates can be combined easily and reliably.

Still further, according to the seventh and eighth aspects of the present invention, by using a plurality of printed boards, complicated circuits can be neatly arranged, and in addition, the case for covering the components to be shielded can be dispensed with. Therefore, these aspects of the invention provide an advantage in terms of cost.

Still further, according to the ninth aspect of the present invention, a complete shield can be provided, and according to the tenth aspect of the present invention, heat radiation effects are improved.

What is claimed is:

1. A device for shielding an electronic circuit for aircraft, comprising:

a first metallic plate disposed between an electronic component radiating electromagnetic waves and a printed circuit board;

a second metallic plate disposed so as to cover said electronic component; and wherein said second metallic plate is connected with said first metallic plate so as to obtain a case, said first metallic plate is connected to a chassis which becomes a frame ground by a lead wire; and a width of a middle portion of said first metallic plate is substantially equal to or smaller than a width of said eletronic component.

2. A device for shielding an electronic circuit for aircraft according to claim 1, wherein said first metallic plate is U-shaped and having upstanding parts obtained by bending side portions upward and said second metallic plate is U-shaped and having upstanding parts obtained by bending side portions downward, and said first and second metallic plates are connected each other so as to obtain a case.

3. A device for shielding an electronic circuit for aircraft according to claim 1, wherein said first metallic plate is a flat plate and having a pair of projections defining on both side portions and said second metallic plate is a box shape opened downward and having holes or recess portions on side walls thereof, and said first and second metallic plates are connected by engaging said holes or recess portions with said projections so as to obtain a case.

4. A device for shielding an electronic circuit for aircraft according to claim 2, wherein said first and second metallic plates are connected by elastic action of side portions of metallic plates so as to obtain a case.

* * * * *